United States Patent
Fuchs et al.

(10) Patent No.: US 6,720,026 B2
(45) Date of Patent: Apr. 13, 2004

(54) METHOD FOR IMPROVING THE OPTICAL SEPARATION OF FLUORESCENT LAYERS

(75) Inventors: Manfred Fuchs, Nuremberg (DE); Erich Hell, Erlangen (DE); Detlef Mattern, Erlangen (DE); Bernhard Schmitt, Erlangen (DE)

(73) Assignee: Siemens Aktiengesellschaft, München (DE)

(*) Notice: Subject to any disclaimer, the term of this patent is extended or adjusted under 35 U.S.C. 154(b) by 31 days.

(21) Appl. No.: 09/764,950

(22) Filed: Jan. 17, 2001

(65) Prior Publication Data
US 2001/0010831 A1 Aug. 2, 2001

(30) Foreign Application Priority Data
Jan. 17, 2000 (DE) .......................................... 100 01 671

(51) Int. Cl.[7] .............................. B05D 5/12; B05D 5/06
(52) U.S. Cl. ................................. 427/65; 427/69; 427/70
(58) Field of Search ............................... 427/65, 69, 70

(56) References Cited

U.S. PATENT DOCUMENTS 3,825,763 A    7/1974    Lightenberg et al.

FOREIGN PATENT DOCUMENTS

| DE | PS 42 19 347 | 5/1996 |
| DE | PS 195 16 450 | 8/1996 |
| DE | OS 198 52 326 | 11/1999 |
| EP | 0 175 578 | 12/1990 |
| EP | 0 698 932 | 2/1996 |

OTHER PUBLICATIONS

Vapour–Deposited CsI:No Layers, 3. Morphologic and Cystallographic Properties, Stevels et al., Philips Res. Repts. 29 (1974) pp. 340–352.

Vapour–Deposited CsI:No Layers, II. Screens for Application in X–ray Imaging Devices, Stevels et al., Philips Res. Repts. 29 (1974) pp. 353–362.

Computersimulation des Photonentransports in CsI–Eingangsschinmen von Röngenbildverstärkern Eckernbach, Unsere Forschung in Deutschland (Philips) vol. IV (1989) pp 51–53.

Effect of the Mobility of Metal Atoms on the Structure of Thin Films Deposited at Oblique Incidence, van de Waterbeems et al., Philips Res. Repts. vol. 22 (1967) pp. 375–387.

Evolutionary Selection, A Principle Governing Growth Orientation in Vapour–Deposited Layers, van der Drift, Philips Res. Repts. vol. 22 (1967) pp. 267–268.

Primary Examiner—Shrine P. Beck
Assistant Examiner—Michael Cleveland
(74) Attorney, Agent, or Firm—Schiff Hardin LLP

(57) ABSTRACT

In a method for improving the optical separation of needle-shaped fluorescent layers, made from a fluorescent material, which are formed by vapor deposition on a substrate, vapor deposition is controlled so that the fluorescent layer is deposited on the substrate with a density which is reduced in comparison to the density that the fluorescent material has as a solid.

13 Claims, 1 Drawing Sheet

METHOD FOR IMPROVING THE OPTICAL SEPARATION OF FLUORESCENT LAYERS

BACKGROUND OF THE INVENTION

1. Field of the Invention

The present invention relates to a method for improving the optical separation of needle-shaped fluorescent layers which are formed by vapor deposition onto a substrate, in particular for an X-ray detector.

2. Description of the Prior Art

Needle-shaped fluorescent layers can be produced by the vapor deposition of alkali metal halides (for example NaCl, CsI, CsBr, RbBr, RbFBr, RbFCl) as absorber material for X-ray radiation or as host lattice for the dopants such as, for example, NaI, $EuBR_2$, TII, GaBr, $EuCl_2$ etc. (Stevels, Schrama; "Vapour-Deposited CsI:Na Layers, I. Morphologic and Crystallographic Properties", Philips Res. Repts 29, 340–352, 1974). The vapor deposition of fluorescent materials is an alternative for the production of binderless fluorescent storage panels (European Application 0 175 578). In order to obtain a good modulation transfer function (MTF) for these fluorescent layers, there is a need for small needle diameters (<40 μm). The needles must be surrounded with cracks (gaps) of 0.3 to 3 μm for the purpose of optical separation (Eckenbach, "Computersimulation des Photonentransports in CsI-Eingangsschirmen von Röntgenbildverstärkern" ["Computer simulation of the photon transport in CsI input screens of X-ray image intensifiers"], Unsere Forschung in Deutschland, Volume IV, 51–53, Philips, 1989). However, this requirement can be met only with very special environmental conditions during the production of the fluorescent layers.

The utilization of the differences in expansion between the substrate and the vapor-deposited fluorescent layer has become established as the most frequently practiced method for producing the required cracks between the needles. In this case, vapor deposition has been performed at a relatively high substrate temperature, and upon cooling—given a correct choice of material—the fluorescent layer shrinks more than the substrate situated therebelow, and this leads to thermal stresses and therefore to cracks or gaps (Stevels, Schrama; "Vapour-Deposited CsI:Na Layers, II. Screens for Application in X-ray Imaging Devices", Philips Res. Repts 29, 353–362, 1974). Examples of the correct choice of material are CsI on aluminum and CsBr on glass. This method has the disadvantage that the needle diameter of the fluorescent layer increases substantially with increasing substrate temperature, and therefore the MTF decreases (Waterbeemd, Oosterhout; "Effect of the Mobility of Metal Atoms on the Structure of Thin Films Deposited at Oblique Incidence", Philips Res. Repts 22, 375–387; 1967).

A second variant for producing fissures or cracks in the fluorescent layer which are necessary for a good MTF is to carry out vapor deposition at low substrate temperatures (50° C.), and to subject the layer thereafter to heat treatment (500° C.) (Stevels, Schrama; "Vapour-Deposited CsI:Na Layers, I. Morphologic and Crystallographic Properties", Philips Res. Repts 29, 340–352, 1974). The disadvantage of this method is grounded in the re-crystallization of the fluorescent layer at the tempering step. A "grain coarsening" occurs in this case, thereby leading to larger block widths and thus to a poorer MTF.

A third variant is "oblique vapor deposition". In this method, the vapor jet of the fluorescent material strikes the substrate at a flat angle during vapor deposition. A good separation between the needles is achieved by "shadowing" as early as in the seeding phase (European Application 0 175 578). In the practical implementation, either the substrate is arranged rotating obliquely relative to the evaporator vessel, or the vapor jet is "directed" to a horizontally rotating substrate in a fashion channeled by "chimneys". Disadvantages of this technique are to be seen in that, firstly, the vapor deposition of large substrates (Ø>40 cm) is very expensive in terms of apparatus and, secondly, the needles grow obliquely on the substrate in accordance with the angle of incidence of the vapor jet (Eckenback; Philips, "Computer-simulation des Photonentransports in CsI-Eingangsschirmen von Röntgenbildverstärkern" ["Computer simulation of the photon transport in CsI input screens of X-ray image intensifiers"], Volume IV, 51–53, 1989). This results in different layer properties over the surface (vignetting effect in the case of X-ray excitation).

A fourth variant of the known method of production is vapor deposition of the fluorescent material onto a structured support (wire fabric, photoetched substrate etc.), the "depressions" in the substrate constituting a barrier against surface diffusion, and the "raised" surface elements exerting a "shadow effect" on the "neighbors" (Stevels, Schrama; "Vapour-Deposited CsI:Na Layers, II. Screens for Application in X-ray Imaging Devices" Philips Res. Repts 29, 353–362, 1974).

In addition to the frequently very complicated steps in the production of the fluorescent layers according to one of these known methods, they do not all lead to an optimum optical separation of the needle-shaped fluorescent layers.

It is known from German OS 198 52 326, German OS 195 16 450, German OS 42 19 347 and U.S. Pat. No. 3,825,763 for fluorescent layers to be vapor deposited with substrate temperatures of 50° to 250° C.

Moreover, in connection with the production of oxide layers it is known from European Application 0 698 932 to feed cooled reactive gas in order to improve the crystallinity of the layer produced.

SUMMARY OF THE INVENTION

It is an object of the present invention to provide a method of the type described above so that, upon vapor deposition, needle structures are produced which are of the smallest possible diameter and are optically separated from one another effectively by cracks, thus producing an improvement in the optical separation of the fluorescent layers.

This object is achieved in a method according to the invention wherein vapor deposition is controlled so that a fluorescent layer is deposited on a substrate with a density which is reduced in comparison with to density that the fluorescent material has as a solid, the density, preferably reduced by 5% to 50%, in the deposited layer producing fissures between the fluorescent needles and pores or defects and dislocations in the crystal structure (lattice defects).

In order to reduce the density, in an embodiment of the invention, before striking the substrate the vapor jet is cooled, preferably by conducting cool inert gas, for example argon, through the vapor-deposition apparatus.

In a further version of this embodiment of the invention the gas pressure of the inert gas, which is introduced by a control valve into the vapor-deposition apparatus and discharged again via a pump, is below 10 Pa, preferably between 1 Pa and 3 Pa.

A very considerable reduction in density results from this use of cooled inert gas. The temperature of the inert gas is, for example, between 0° C. and 100° C., preferably at approximately room temperature, as a result of which the vapor, at a temperature of approximately 650° C. can, of course, be strongly cooled, when the vapor strikes substrate, which also is preferably cooled so that its temperature is preferably kept at between 50° C. and 200° C. A substantial reduction in density, and thus a good optical separation of the fluorescent needles which results therefrom, are ensured by the combination of the cooling of the vapor jet and the cooling of the substrate to a temperature which is much lower than the vapor temperature.

Physically, the reduced density can be explained with larger lattice spacings in the case of phase conversions of polymorphous crystals (NaCl type or CsCl type in the case, for example, of CsBr, CsCl, TlBr etc.) and/or by the formation of lattice defects by means of a high vapor deposition rate. In an embodiment of the invention the vapor deposition rate is preferably above 1 mg cm$^{-2}$min$^{-1}$. The reduced density also can be explained by the "freezing" of the lower density of the liquid. The density of CsBr, for example, is 3.05 g cm$^{-3}$ in the liquid state, and 4.44 g cm$^{-2}$ in the solid state. The ratio at which the reduced density becomes noticeable either as fissures between needles or as lattice defects inside the needles can be influenced by the vapor deposition rate.

In the event of an excessively high inert gas pressure and/or excessively low substrate temperature, however, no more fluorescent needles can be formed because new seeds are always forming on the surface, which can no longer be connected to the already condensed layer. Substrate temperatures of between 50° C. and 200° C. and argon pressures of between 1 Pa and 3 Pa, for which a 10–30% reduction in density is achieved, have proved to be virtually optimum.

DESCRIPTION OF THE PREFERRED EMBODIMENTS

Figure 1:
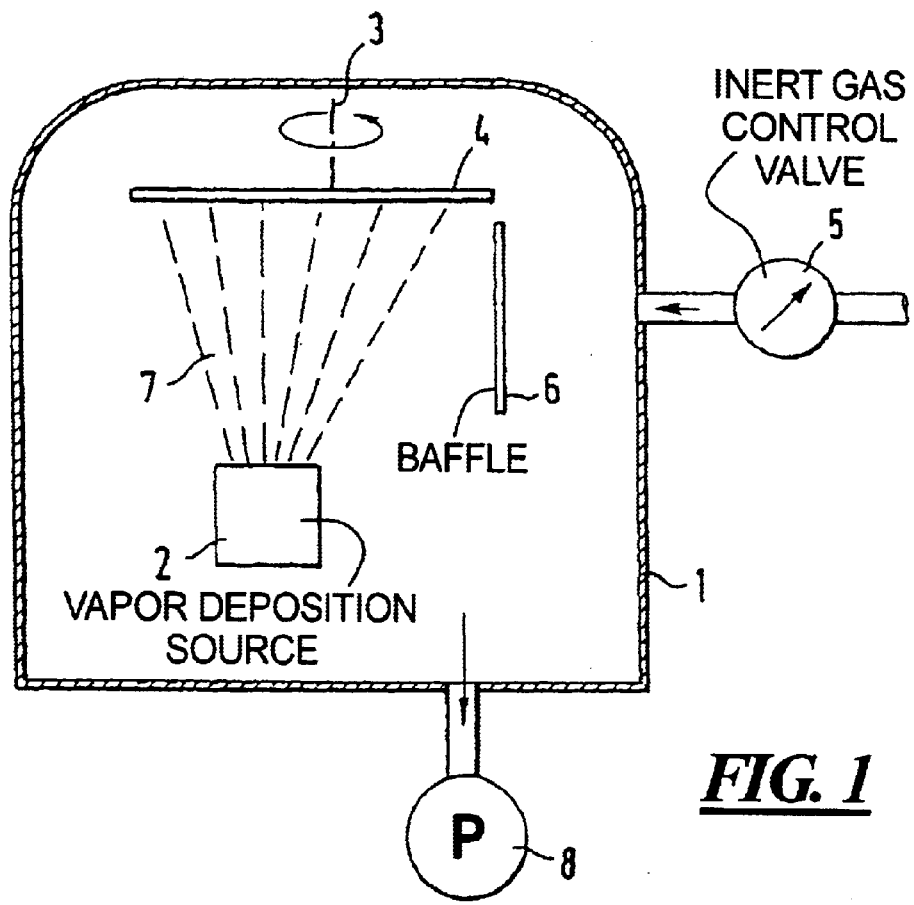
FIG. 1 is a schematic illustration of a vapor-deposition apparatus for carrying out the method according to the invention.
Figure 2:
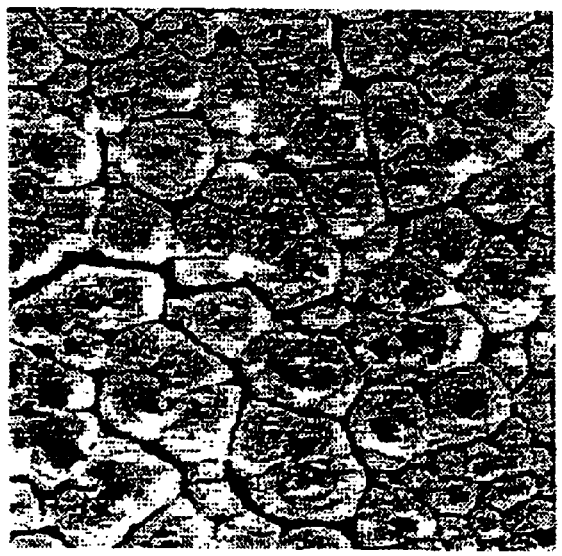
FIG. 2 shows an REM (raster electron microscope) photograph of a fluorescent layer, which was applied to a substrate with a substrate temperature of 160° C. in conjunction with an argon pressure of 2 Pa in accordance with the inventive method.

The vapor-deposition apparatus, shown schematically in FIG. 1, for carrying out the method according to the invention has a vacuum vessel 1 in which a vapor-deposition source 2 is arranged opposite the substrate 4, which preferably rotates around an axis 3. The vapor-deposition source 2 generates a vapor jet 7 of a fluorescent material, for example one of the alkali metal halides listed above, which is directed onto the substrate 4. Using a control valve 5, an inert gas, such as argon, which is at a very much cooler temperature, for example room temperature, than the vapor temperature, which is typically 650 to 700° C., can be introduced into the vacuum vessel 1. Preferably, as illustrated, the inert gas first strikes a baffle 6 and is not introduced directly into the vapor jet 7. The inert gas is extracted via a vacuum pump 8, the control valve 5 being set so as to produce a pressure of below 10 Pa, preferably between 1 Pa and 3 Pa, inside the vacuum vessel 1. The substrate 4 is kept at a substrate temperature of between preferably 50° C. and 200° C. with a schematically indicated cooling apparatus 9, for example rotating with the substrate 4. In conjunction with the cooling of the vapor jet 7 effected by the inert gas, the cooling of the substrate 4 produces a density of the needle-shaped fluorescent layer, that is deposited on the substrate 4 at a vapor deposition rate of >1 mg cm$^{-2}$min$^{-1}$, which is reduced by 10 to 30% by comparison with the density that the fluorescent material has as a solid. This creates a substantial restructuring, and therefore good optical separation, of the individual needles from one another. This structuring is very well in evidence in FIG. 2, in which the bright needle-shaped structures of the fluorescent layer are all virtually completely separated from one another by cracks of dark appearance. The dark points inside the needles are defects in the needles.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for forming fluorescent layers on a substrate, comprising the steps of:

vapor depositing a needle-shaped fluorescent layer having needle structures with voids therebetween, composed of fluorescent material, by producing a vapor jet of said fluorescent material onto a substrate in a vapor-deposition apparatus;

cooling said vapor jet before said vapor jet strikes said substrate by flowing cool inert gas through said vapor-deposition apparatus during the vapor depositing; and controlling vapor deposition of said fluorescent layer so that said fluorescent layer is deposited on said substrate with lattice imperfections therein, giving said fluorescent it layer a density which is reduced, due to said voids and lattice imperfections, in comparison to a density which said fluorescent material has as a solid, to produce a needle-shaped fluorescent layer with optical separation between needle structures.

2. A method as claimed in claim 1 comprising controlling said vapor deposition to reduce said density of the fluorescent layer by between 5% to 50% of said density that said fluorescent material has as a solid.

3. A method as claimed in claim 1 comprising introducing said inert gas into said vapor deposition apparatus at a gas pressure below 10 Pa.

4. A method as claimed in claim 3 comprising introducing said inert gas into said vapor-deposition apparatus at a pressure between 1 Pa and 3 Pa.

5. A method as claimed in claim 1 comprising diverting said inert gas relative to said vapor jet with a baffle before introducing said inert gas into said vapor jet, causing said inert gas to be introduced indirectly into said vapor jet.

6. A method as claimed in claim 1 comprising discharging said inert gas from said vapor-deposition apparatus with a pump.

7. A method as claimed in claim 1 comprising introducing said inert gas into said vapor-deposition apparatus through a control valve.

8. A method as claimed in claim 1 comprising conducting argon through said vapor-deposition apparatus as said inert gas.

9. A method as claimed in claim 1 comprising introducing said inert gas at a temperature in a range between 0° C. and 100° C.

10. A method as claimed in claim 9 comprising introducing said inert gas at approximately room temperature.

11. A method as claimed in claim 1 comprising cooling said substrate during said vapor deposition.

12. A method as claimed in claim 11 comprising maintaining said substrate at a temperature in a range between 50° C. and 200° C.

13. A method as claimed in claim 1 comprising conducting said vapor-deposition at a rate greater than 1 mg cm$^{-2}$min$^{-1}$.

* * * * *